(12) United States Patent
Shah et al.

(10) Patent No.: US 10,892,143 B2
(45) Date of Patent: Jan. 12, 2021

(54) TECHNIQUE TO PREVENT ALUMINUM FLUORIDE BUILD UP ON THE HEATER

(71) Applicant: Applied Materials, Inc., Santa Clara, CA (US)

(72) Inventors: Vivek Bharat Shah, Sunnyvale, CA (US); Bhaskar Kumar, Santa Clara, CA (US); Anup Kumar Singh, Santa Clara, CA (US); Ganesh Balasubramanian, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 68 days.

(21) Appl. No.: 15/718,087

(22) Filed: Sep. 28, 2017

(65) Prior Publication Data
US 2018/0114679 A1     Apr. 26, 2018

Related U.S. Application Data

(60) Provisional application No. 62/411,316, filed on Oct. 21, 2016.

(51) Int. Cl.
*H01J 37/32* (2006.01)
*C23C 16/44* (2006.01)
(Continued)

(52) U.S. Cl.
CPC ......... *H01J 37/32862* (2013.01); *B08B 5/00* (2013.01); *B08B 7/0035* (2013.01);
(Continued)

(58) Field of Classification Search
CPC ............ H01J 37/32862; H01J 37/3288; C23C 16/4408; C23C 16/4404; C23C 16/4405;
(Continued)

(56) References Cited

U.S. PATENT DOCUMENTS 4,960,662 A * 10/1990 Nishikawa ......... G03G 5/08235
430/64
5,536,330 A 7/1996 Chen et al.
(Continued)

FOREIGN PATENT DOCUMENTS

EP       0774772 A1     5/1997

OTHER PUBLICATIONS

UM CCP (http://uigelz.eecs.umich.edu/pub/presentations/ICOPS2009_Yang_V09.pdf, accesed online Dec. 3, 2018, presented Jun. 2009) (Year: 2009).*
(Continued)

*Primary Examiner* — Michael P Wieczorek
*Assistant Examiner* — Michael G Miller
(74) *Attorney, Agent, or Firm* — Patterson + Sheridan, LLP

(57) ABSTRACT

Implementations of the present disclosure provide methods for treating a processing chamber. In one implementation, the method includes purging a 300 mm substrate processing chamber, without the presence of a substrate, by flowing a purging gas into the substrate processing chamber at a flow rate of about 0.14 sccm/mm$^2$ to about 0.33 sccm/mm$^2$ and a chamber pressure of about 1 Torr to about 30 Torr, with a throttle valve of a vacuum pump system of the substrate processing chamber in a fully opened position, wherein the purging gas is chemically reactive with deposition residue on exposed surfaces of the substrate processing chamber.

17 Claims, 1 Drawing Sheet

(51) Int. Cl.
  *B08B 9/00* (2006.01)
  *B08B 5/00* (2006.01)
  *B08B 7/00* (2006.01)
  *B08B 9/08* (2006.01)
  *C23C 16/24* (2006.01)
  *C23C 16/50* (2006.01)

(52) U.S. Cl.
  CPC .................. *B08B 9/00* (2013.01); *B08B 9/08* (2013.01); *C23C 16/24* (2013.01); *C23C 16/4404* (2013.01); *C23C 16/4405* (2013.01); *C23C 16/4408* (2013.01); *C23C 16/50* (2013.01); *H01J 37/3288* (2013.01)

(58) Field of Classification Search
  CPC ........... C23C 16/50; C23C 16/24; B08B 9/00; B08B 9/08; B08B 7/0035; B08B 5/00
  USPC .......................... 427/248.1–255.7, 569–579
  See application file for complete search history.

(56) References Cited

U.S. PATENT DOCUMENTS

| | | | |
|---|---|---|---|
| 5,647,953 A * | 7/1997 | Williams | B08B 7/0035 134/1.1 |
| 5,843,239 A | 12/1998 | Shrotriya | |
| 6,071,573 A * | 6/2000 | Koemtzopoulos | C23C 16/4404 427/237 |
| 6,358,327 B1 | 3/2002 | Pokharna et al. | |
| 6,444,277 B1 * | 9/2002 | Law | G03G 5/08235 430/64 |
| 6,846,742 B2 | 1/2005 | Rossman | |
| 2002/0146512 A1 * | 10/2002 | Rossman | H01L 21/02274 427/255.28 |
| 2003/0143410 A1 * | 7/2003 | Won | C23C 16/4404 428/448 |
| 2006/0005856 A1 | 1/2006 | Sun et al. | |
| 2006/0093756 A1 * | 5/2006 | Rajagopalan | C23C 16/4404 427/569 |
| 2014/0272184 A1 * | 9/2014 | Sreekala | C23C 16/4404 427/534 |

OTHER PUBLICATIONS

Oxford Instruments (https://nanolab.berkeley.edu/process_manual/chap6/6.20PECVD.pdf , Oxford Instruments Plasma Technology literature, copyright 2003, accessed online Oct. 22, 2020) (Year: 2003).*

* cited by examiner

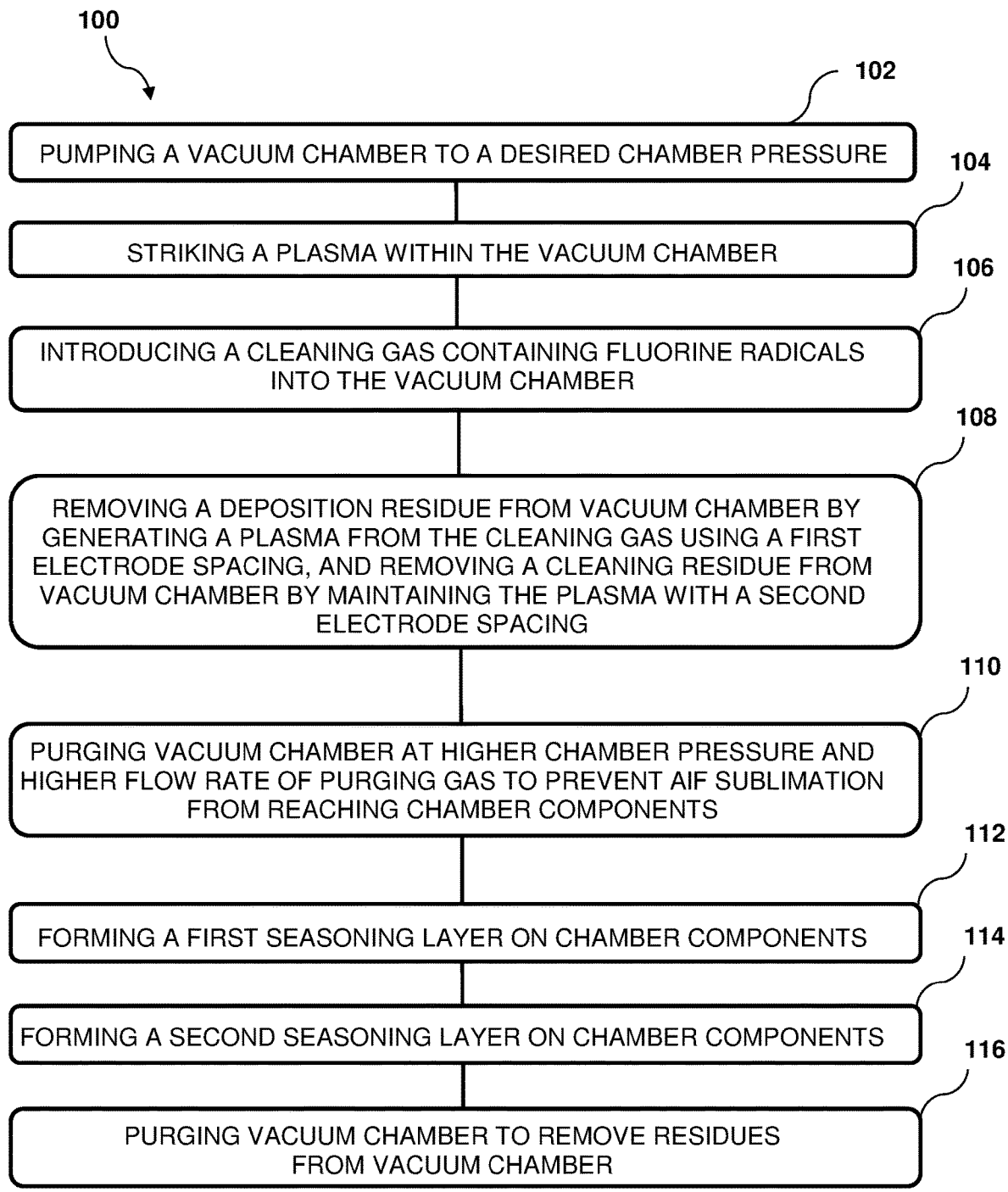

TECHNIQUE TO PREVENT ALUMINUM FLUORIDE BUILD UP ON THE HEATER

CROSS-REFERENCE TO RELATED APPLICATIONS

This application claims priority to U.S. provisional patent application Ser. No. 62/411,316, filed Oct. 21, 2016, which is herein incorporated by reference.

FIELD

Embodiments of the present disclosure generally relate to improved methods for treating a process chamber to reduce undesired deposition.

BACKGROUND

Plasma reactors in semiconductor industry are often made of aluminum-containing materials. Particularly in a poly silicon, metal or oxide etch chamber, an aluminum fluoride layer may form on the aluminum surfaces when fluorine containing gases such as $NF_3$ or $CF_4$ are used as the etching chemistry. It has been observed that formation of the aluminum fluoride has significant vapor pressure above 480 degree Celsius and starts subliming at this temperature. The aluminum fluoride is then transported to the chamber component, such as a faceplate of the process chamber. The aluminum fluoride condenses and forms a layer on the faceplate, which may flake off during a subsequent process in the chamber and contaminate the substrate surface with particles. Aluminum fluoride is difficult to remove and, after the faceplate is contaminated, there are no known methods to provide in-situ cleaning of the faceplate and/or the vacuum chamber. As a result, etch rates within the vacuum chamber drift and the chamber becomes unstable.

Therefore, there is a need in the art to provide an improved process to clean process chamber so that etch rate drifting issue and the possibility of aluminum fluoride contamination on substrate surface during processing are minimized or avoided.

SUMMARY

Implementations of the present disclosure provide methods for treating a processing chamber. In one implementation, the method includes purging a processing chamber, absent presence of a substrate, by flowing a purging gas into the substrate processing chamber at a flow rate of about 0.14 $sccm/mm^2$ to about 0.33 $sccm/mm^2$ and a chamber pressure of about 1 Torr to about 30 Torr, with a throttle valve of a vacuum pump system of the substrate processing chamber in a fully opened position, wherein the purging gas is chemically reactive with deposition residue on exposed surfaces of the substrate processing chamber.

In another implementation, the method includes flowing a cleaning gas comprising fluorine radicals into a processing chamber, removing a deposition residue from interior surfaces of the substrate processing chamber by generating a plasma from the cleaning gas, the plasma is formed at a first RF power density, a first chamber pressure, and a first electrode spacing for a first period of time, removing a cleaning residue from interior surfaces of the substrate processing chamber by maintaining the plasma at a second RF power density, a second chamber pressure, and a second electrode spacing that is different from the first electrode spacing for a second period of time, wherein the first chamber pressure and the second chamber pressure is below 1 Torr, and purging the substrate processing chamber, without the presence of a substrate, by flowing a purging gas into the substrate processing chamber at a flow rate of about 0.14 $sccm/mm^2$ to about 0.33 $sccm/mm^2$ and a chamber pressure of about 1 Torr to about 30 Torr, with a throttle valve of a vacuum pump system of the substrate processing chamber being fully opened for a third period of time, wherein the purging gas is chemically reactive with deposition residue on interior surfaces of the substrate processing chamber, and the purging gas deposits an amorphous silicon layer on a surface of a substrate support disposed within the substrate processing chamber.

In yet another implementation, a method for processing a substrate in a processing chamber is provided. The method includes performing a pre-defined number of processes on a substrate disposed on a substrate support within a 300 mm substrate processing chamber, removing the substrate from the substrate processing chamber, and purging the substrate processing chamber by flowing a purging gas into the substrate processing chamber at a flow rate of about 0.14 $sccm/mm^2$ to about 0.33 $sccm/mm^2$ and a chamber pressure of about 1 Torr to about 5 Torr, with a throttle valve of a vacuum pump system of the substrate processing chamber being fully opened for a third period of time, wherein the purging gas is chemically reactive with a deposition residue comprising aluminum fluoride on interior surfaces of the substrate processing chamber and the purging gas deposits an amorphous silicon layer on a surface of the substrate support.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIG. 1 depicts a flow chart of a method for cleaning a vacuum chamber according to implementations of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Implementations of the present disclosure generally provide improved methods for cleaning of a vacuum chamber to remove adsorbed contaminants therefrom prior to a chamber seasoning process. The contaminants may be formed from the reaction of cleaning gases with the chamber components and the walls of the vacuum chamber.

FIG. 1 depicts a flow chart of a method 100 for cleaning a vacuum chamber according to implementations of the present disclosure. The vacuum chamber may be any suitable substrate processing chamber using thermal and/or plasma to enhance the performance of the process, for example a chemical vapor deposition (CVD) chamber or a plasma-enhanced chemical vapor deposition (PECVD)

chamber. In one exemplary implementation, the vacuum chamber is an RF powered plasma processing chamber having at least a gas inlet manifold, a substrate support, and a vacuum pump system.

The method 100 is generally performed without the presence of the substrate in the vacuum chamber. The method 100 may be performed before and/or after processing of a single or batch of substrates within the vacuum chamber. The batch of substrates may be between 2 and 15, for example 3 to 12, such as 6 to 10. Such processes may include, for example, etching of the substrates or depositing a material layer on a surface of the substrates. Although various operations are illustrated in the drawings and described herein, no limitation regarding the order of such operations or the presence or absence of intervening operations is implied. Operations depicted or described as sequential are, unless explicitly specified, merely done so for purposes of explanation without precluding the possibility that the respective operations are actually performed in concurrent or overlapping manner, at least partially if not entirely.

In one implementation, the method 100 starts at block 102 by pumping a 300 mm plasma processing chamber to reduce and maintain the pressure in the plasma processing chamber at a base pressure, for example about 0.67 mPa (5 mTorr). The pumping time for the chamber may be between about 1 second to about 6 seconds depending on chamber size, for example about 3 seconds. The pumping time may vary depending on the size of the plasma processing chamber used.

At block 104, the plasma processing chamber is filled with a plasma initiation gas, such as argon, nitrogen, or helium etc. In one exemplary implementation, the plasma initiation gas is argon. The plasma initiation gas may be flowed into the plasma processing chamber for about 8 seconds to about 20 seconds, for example about 15 seconds for a 300 mm plasma processing chamber, until gas flow is stabilized. A plasma power of about 0.56 watts/cm$^2$ may be supplied to the plasma processing chamber to ignite the plasma.

At block 106, a cleaning gas is introduced into the plasma processing chamber through the gas inlet manifold. The cleaning gas may include fluorine ($F_2$ and/or F) and/or fluorine radicals (F*). As a source of these species, the cleaning gas may comprise a perfluorinated or hydrofluorocarbon compound, for example $NF_3$, $CF_4$, $C_2F_6$, $CHF_3$, $C_3F_8$, $C_4F_3$, and $SF_6$. In one exemplary implementation, the cleaning gas is $NF_3$. For a 300 mm plasma processing chamber, the cleaning gas may be introduced into the plasma processing chamber at a flow rate of about 150 sccm to about 800 sccm, for example about 300 sccm to about 600 sccm for about 1 second to about 6 seconds, or for example about 3 seconds. It is contemplated that the cleaning gas may be introduced into the plasma processing chamber from a remote plasma system.

At block 108, while flowing the cleaning gas into the plasma processing chamber, the electrode spacing between a gas inlet manifold electrode and a substrate support electrode of the plasma processing chamber is adjusted to control or enhance effectiveness of the chamber cleaning process. In one exemplary implementation, the cleaning process is a two-stage process. A first stage includes using a first relatively low pressure and a first relatively large electrode spacing, with selected first RF power applied between the electrodes, for generating a plasma throughout the plasma processing chamber to clean a deposition residue from the interior surfaces of the plasma processing chamber.

A second stage includes maintaining the plasma using a second relatively high pressure and a second relatively small electrode spacing, with selected second RF power applied between the electrodes, to clean a cleaning residue from the interior surfaces of the plasma processing chamber. In some examples, the second relatively high pressure and the first relatively low pressure may be lower than 1 Torr, for example between about 10 mTorr to about 950 mTorr.

In one example, the first relatively low pressure is about 20 mTorr to about 450 mTorr, for example about 100 mTorr to about 300 mTorr, the first relatively large electrode spacing is about 500 mils to about 1000 mils, for example about 600 mils for a 300 mm plasma processing chamber, and the first RF power is about 500 watts to about 750 watts (power density about 2.7-5.6 watts/cm$^2$). The first stage may be performed for about 6 seconds to about 13 seconds, for example 10 seconds. The second relatively high pressure is about 500 mTorr to about 900 mTorr, for example about 600 mTorr to about 800 mTorr, the second relatively small electrode spacing is about 100 mils to about 400 mils, for example about 100 mils to about 300 mils, and the second RF power is about 500 watts to about 750 watts (power density about 2.7-5.6 watts/cm$^2$). The second stage may be performed for about 15 seconds to about 30 seconds, for example 20 seconds.

At block 110, after the chamber cleaning process, the plasma processing chamber is purged at higher chamber pressure and higher flow rate. It has been observed by the present inventors that immediately after chamber cleaning, aluminum fluoride will transport to the faceplate from the substrate support if the chamber pressure is low (e.g., below 1 Torr). Therefore, purging the chamber at higher pressure prevents vaporization of aluminum fluoride from reaching the faceplate of the plasma processing chamber. Flowing of the purging gas at higher pressure also helps remove aluminum fluoride and other unwanted residues from the faceplate of the process chamber and exposed interior surfaces of other chamber components.

The purging may be performed by flowing a purging gas into the plasma processing chamber through the gas inlet manifold. The purging gas may include, for example, nitrogen, argon, neon, or other suitable inert gases, as well as combinations of such gases. In one exemplary implementation, the purging gas is argon. In another exemplary implementation, the purging gas is argon and nitrogen.

In some alternative implementations, the purging gas may include silicon-containing gas such as silane. Suitable silane may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), or other higher order silanes such as polychlorosilane. In one exemplary implementation, the purging gas is silane. It has been observed by the present inventors that purging with silane is effective in scavenging aluminum fluoride residues and free fluorine radicals that are present in the plasma processing chamber. The silane purge also deposits a thin amorphous silicon layer on the substrate support (and exposed interior surfaces of the chamber components) when the temperature of the substrate support reaches 500 degree Celsius or above (e.g., 550 degree Celsius to 650 degree Celsius or above). The amorphous silicon layer serves as a capping layer which prevents aluminum fluoride from sublimating and reaching the faceplate and/or exposed interior surfaces of other chamber components such as chamber walls. It is contemplated that instead of silane, any precursor gas that is chemically reactive with deposition residue (e.g., fluorine) and/or deposits by CVD or PECVD can also be used.

During purging, the pressure within the plasma processing chamber is maintained at about 1 Torr to about 30 Torr, such as about 1 Torr to about 3 Torr, about 1 Torr to about 5 Torr, about 1.2 Torr to about 1.5 Torr, about 1.5 Torr to about 1.8 Torr, about 1.8 Torr to about 3 Torr, or about 1 Torr to about 15 Torr. The temperature of the plasma processing chamber may be maintained at about 500 degree Celsius or above, for example about 550 degree Celsius to about 650 degree Celsius. To achieve a higher chamber pressure, the purging gas may be introduced into the plasma processing chamber for a longer period of time with a throttle valve of the vacuum pump being fully opened to allow contaminants (e.g., vaporized deposition residue) to be pumped from the plasma processing chamber while the required chamber pressure is maintained. In various examples discussed herein, the purging time may vary between about 10 seconds to about 90 seconds, for example about 15 seconds to about 45 seconds. In one exemplary implementation, the purging time is about 20 seconds.

The purging gas may be introduced into the plasma processing chamber at a flow rate of about 4000 sccm to about 30000 sccm, such as about 8000 sccm to about 24000 sccm, for example about 10000 to about 20000 sccm for a 300 mm plasma processing chamber. If two purging gases are used, the first purging gas, for example argon, may be flowed at a flow rate of about 8000 sccm to about 15000 sccm, such as about 13000 sccm, and the second purging gas, for example nitrogen, may be flowed at a flow rate of about 16000 sccm to about 24000 sccm, for example about 20000 sccm. It should be noted that the processing conditions as described in this disclosure are based on a 300 mm processing chamber.

In one example, the purging gas comprising argon is introduced into a 300 mm plasma processing chamber at a flow rate of about 13000 sccm and a chamber pressure of about 1.8 Torr (TFO). In another example, the purging gas comprising argon is introduced into the plasma processing chamber at a flow rate of about 13000 sccm and a chamber pressure of about 3 Torr (TFO). In one another example, the purging gas comprising nitrogen is introduced into the plasma processing chamber at a flow rate of about 10000 sccm and a chamber pressure of about 2 Torr to 3 Torr (TFO). In yet another example, a first purging gas comprising argon is introduced into the plasma processing chamber at a flow rate of about 13000 sccm and a second purging gas comprising nitrogen is introduced into the plasma processing chamber at a flow rate of about 20000 sccm, with a chamber pressure of about 3 Torr (TFO).

At block 112, after purging of the plasma processing chamber, the purging gas(es) is stopped and a first chamber seasoning process is optionally performed to form a first seasoning layer on exposed interior surfaces of the chamber components, such as the faceplate and/or chamber walls. The first chamber seasoning process may be performed by introducing a first seasoning gas and a second seasoning gas into the plasma processing chamber, either sequentially or in a gas mixture, through the gas inlet manifold. The first seasoning layer reduces the quantity of residual process particles which remain in the plasma processing chamber after purging or any prior process are carried out in the chamber. This reduces the quantity of contaminating particles which would otherwise contaminate layers to be deposited on substrates in subsequent processes.

In one exemplary implementation, the first seasoning layer is a silicon oxide layer which may be deposited by reacting a silicon-containing gas with an oxygen-containing precursor gas in the plasma processing chamber. In one example, a silicon dioxide seasoning layer is formed by reacting silane gas with molecular oxygen. In another example, the silicon dioxide seasoning layer is formed by reacting silane with nitrous oxide, nitric oxide, nitrogen dioxide, carbon dioxide, or any other suitable oxygen-containing precursor gas. In another exemplary implementation, the first seasoning layer is an amorphous silicon layer which may be deposited by reacting a hydrogen-containing gas with a silicon-containing gas in the plasma processing chamber.

The hydrogen-containing gas and the silicon-containing gas may be provided into the plasma processing chamber in a ratio of about 1:6 to about 1:20 and a chamber pressure between about 0.1 Torr and about 20 Torr. In one example, an amorphous silicon seasoning layer is formed by reacting a hydrogen gas with silane. Silane gas may be provided at a flow rate of about 3000 sccm to about 6000 sccm, such as about 5000 sccm, and the hydrogen gas may be provided at a flow rate of about 60 sccm to about 150 sccm, such as about 100 sccm, for a 300 mm plasma processing chamber. An RF power of about 15 milliWatts/cm2 to about 250 milliWatts/cm2 may be provided to the gas inlet manifold of the plasma processing chamber. In various examples, the first chamber seasoning process may be performed about 3 seconds to about 8 seconds, for example about 5 seconds. The processing time may vary depending on a desired thickness of the first seasoning layer.

While silane is discussed herein, it is contemplated that higher silanes with the empirical formula $Si_xH_{(2x+2)}$, such as disilane ($Si_2H_6$), trisilane ($Si_3H_3$), and tetrasilane ($Si_4H_{10}$) may also be used.

In cases where the purging at block 110 forms an amorphous silicon layer on the substrate support, no further chamber pumping or purging is needed between chamber purge (block 110) and first chamber seasoning process (block 112) because the silane purging, for example, provides an initial seasoning layer for the plasma processing chamber that prevents aluminum fluoride from sublimating and reaching the faceplate and/or exposed interior surfaces of other chamber components such as chamber walls. This new purging approach may be advantageous over some conventional purging procedures where argon purge and pump operations are alternatingly performed in the plasma processing chamber after chamber cleaning (block 108). For example, after chamber cleaning (block 108), a conventional purging procedure may include Ar Purge/Pump/Ar Purge/Pump. In contrast, implementations of the present disclosure feature a higher-pressure, high-flowrate chamber purging for effective cleaning and prevention of aluminum fluoride vaporization, without the need for additional purge/pump cycle between chamber cleaning and chamber seasoning.

At block 114, after the first chamber seasoning process is done, a second chamber seasoning process is optionally performed to deposit a second seasoning layer on the first seasoning layer. The second seasoning layer may be performed by introducing a third seasoning gas and a fourth seasoning gas into the plasma process chamber, either sequentially or in a gas mixture, through the gas inlet manifold. In one exemplary implementation, the second seasoning layer is an undoped silicate glass which may be deposited by reacting a silicon-containing gas with an oxygen-containing precursor gas in the plasma processing chamber. In one example, an undoped silicate glass seasoning layer is formed by reacting tetraethylorthosilane (TEOS) with ozone ($O_3$). It is contemplated that additional silicon sources such as silane, TMCT or similar sources, and other oxygen sources such as $O_2$, $H_2O$, $N_2O$ and similar sources and mixtures of the same also can be employed. When TEOS is used as a silicon-containing gas, a carrier gas such as helium or nitrogen may be employed. The ratio of $O_3$ to TEOS may range from about 2:1 to about 16:1, such as about 3:1 to about 6:1.

During deposition of the second seasoning layer, TEOS may be introduced into a 300 mm plasma processing chamber at a flow rate of between about 600 mgm to about 3500 mgm, for example about 1200 mgm to about 1600 mgm. $O_3$ (between about 5-16 wt % oxygen) is introduced at a flow rate of between about 2500 sccm to about 16000 sccm, such as about 5500 sccm to about 12000 sccm. Helium or nitrogen may be used as a carrier gas that is introduced at a flow rate of between 2600 sccm to about 12000 sccm, such as about 4500 sccm to about 8500 sccm. In most cases, the total flow of gases into the plasma processing chamber may be varied between about 8000 sccm to about 30000 sccm, such as about 15000 sccm to about 22000 sccm. In various examples, the second chamber seasoning process may be performed for about 6 seconds to about 15 seconds, for example about 9 seconds. The processing time may vary depending on a desired thickness of the second seasoning layer.

At block 116, the plasma processing chamber is purged with a purging gas to remove any processing residues (e.g., silane) from the plasma processing chamber. The purging may be performed by flowing a purging gas into the plasma processing chamber through the gas inlet manifold. The purging gas may include, for example, nitrogen, argon, neon, or other suitable inert gases, as well as combinations of such gases. In one exemplary implementation, the purging gas is argon. The process condition for the purging at block 116 may be identical or similar to those discussed at block 110 except that the purging time at block 116 is shorter. For instance, the purging time may vary between about 2 seconds to about 10 seconds, such as about 3 seconds to about 8 seconds. In one exemplary implementation, the purging time is about 5 seconds. Thereafter, any reaction residues and/or unwanted gases are pumped out of the plasma processing chamber through the vacuum pump system.

After completion of block 116, the method 100 may proceed to an end, or start again from block 102 to 116. It is contemplated that the method 100 described herein may also be performed periodically. For example, the method 100 may be performed after every two deposition processes are done on the substrate or after performing a pre-defined number of processes (e.g., deposition process) in a batch processing cycle. The pre-defined number may be between 1 and 6, for example 2 to 5, such as 3 processes. Depending upon the chamber conditions, any of the processes as described at blocks 102 to 116 may be repeated as many times as necessary until a desired chamber condition is achieved or a standard full chamber cleaning process becomes necessary.

Benefits of the present disclosure include purging a vacuum chamber at higher pressure and higher flow rate to prevent aluminum fluoride vaporization from reaching a faceplate and/or exposed interior surfaces of other chamber components of the vacuum chamber. Flowing of the purging gas at higher pressure help removes aluminum fluoride and other unwanted residues from the faceplate of the process chamber. In cases where silane is used to purge the vacuum chamber, the silane gas deposits a thin amorphous silicon layer on the substrate support when the temperature of the substrate support reaches 500 degree Celsius or above. Silane also scavenges free fluorine radicals that are present in the vacuum chamber. This amorphous silicon layer prevents aluminum fluoride from sublimating and reaching the faceplate. It has been observed that only 0.2-0.3 μm thickness of aluminum fluoride is deposited on the faceplate after processing of 1000 substrates. As a result, the life time of the faceplate and/or chamber components are elongated. The etch rate drifting or wafer temperature drifting (due to faceplate emissivity change from AlF build up) in the vacuum chamber is avoided and the overall chamber stability is improved.

While the foregoing is directed to embodiments of the present disclosure, other and further embodiments of the disclosure may be devised without departing from the basic scope thereof.

The invention claimed is:

1. A method for treating a substrate processing chamber, comprising:
purging the substrate processing chamber, absent presence of a substrate, by introducing and flowing a purging gas comprising a silicon-containing gas into the substrate processing chamber at a substrate support temperature of about 500 degree Celsius or above and a chamber pressure of about 1 Torr to about 30 Torr, with a throttle valve of a vacuum pump system of the substrate processing chamber in a fully opened position, to deposit an amorphous silicon layer on at least a surface of a substrate support disposed within the substrate processing chamber, wherein the purging gas removes contaminants from the substrate processing chamber and is chemically reactive with deposition residue on exposed surfaces of the substrate processing chamber.

2. The method of claim 1, wherein the chamber pressure is maintained at about 1.8 Torr to about 3 Torr.

3. The method of claim 1, wherein the purging gas further comprises argon.

4. The method of claim 1, wherein the deposition residue comprises aluminum fluoride.

5. The method of claim 1, wherein the silicon-containing gas comprises silane ($SiH_4$), disilane ($Si_2H_6$), trisilane ($Si_3H_8$), tetrasilane ($Si_4H_{10}$), or polychlorosilane.

6. A method for treating a processing chamber, comprising:
flowing a cleaning gas comprising fluorine radicals into the substrate processing chamber;
removing a deposition residue from interior surfaces of the substrate processing chamber by generating a plasma from the cleaning gas, the plasma is formed at a first RF power density, a first chamber pressure, and a first electrode spacing for a first period of time;
removing a cleaning residue from interior surfaces of the substrate processing chamber by maintaining the plasma at a second RF power density, a second chamber pressure, and a second electrode spacing that is different from the first electrode spacing for a second period of time, wherein the first chamber pressure and the second chamber pressure is below 1 Torr; and
purging the substrate processing chamber, without the presence of a substrate, by introducing and flowing a purging gas into the substrate processing chamber at a substrate support temperature of about 500 degree Celsius or above and a chamber pressure of about 1 Torr to about 30 Torr, with a throttle valve of a vacuum pump system of the substrate processing chamber being fully opened for a third period of time, wherein the purging gas removes contaminants from the substrate processing chamber and is chemically reactive with deposition residue on interior surfaces of the substrate processing chamber, and the purging gas deposits an amorphous silicon layer on a surface of a substrate support disposed within the substrate processing chamber.

7. The method of claim 6, further comprising:
after purging the substrate processing chamber, performing a first chamber seasoning process by exposing interior surfaces of the substrate processing chamber to a silicon-containing gas.

8. The method of claim 7, wherein the first silicon-containing seasoning layer comprises silicon oxide.

9. The method of claim 7, wherein the first silicon-containing seasoning layer comprises amorphous silicon.

10. The method of claim 7, wherein the purging gas comprises argon and the silicon-containing gas comprises silane ($SiH_4$).

11. The method of claim 6, wherein the chamber pressure during purging is maintained at about 1.8 Torr to about 3 Torr.

12. The method of claim 6, wherein the deposition residue comprises aluminum fluoride.

13. The method of claim 6, wherein the first period of time is about 6 seconds to about 13 seconds, the second period of time is about 15 seconds to about 30 seconds, and the third period of time is about 15 seconds to about 45 seconds.

14. A method for processing a substrate in a processing chamber, comprising:
performing a pre-defined number of processes on a substrate disposed on a substrate support within the substrate processing chamber;
removing the substrate from the substrate processing chamber; and
purging the substrate processing chamber by introducing and flowing a purging gas into the substrate processing chamber at a substrate support temperature of about 500 degree Celsius or above and a chamber pressure of about 1 Torr to about 5 Torr, with a throttle valve of a vacuum pump system of the substrate processing chamber being fully opened for a third period of time, wherein the purging gas removes contaminants from the substrate processing chamber and is chemically reactive with a deposition residue comprising aluminum fluoride on interior surfaces of the substrate processing chamber, and the purging gas deposits an amorphous silicon layer on a surface of the substrate support.

15. The method of claim 14, further comprising:
prior to purging the substrate processing chamber, performing the following:
flowing a cleaning gas comprising fluorine radicals into the substrate processing chamber;
removing a deposition residue from interior surfaces of the substrate processing chamber by generating a plasma from the cleaning gas, the plasma is formed at a first chamber pressure and a first electrode spacing; and
removing a cleaning residue from interior surfaces of the substrate processing chamber by maintaining the plasma at a second chamber pressure and a second electrode spacing that is different from the first electrode spacing.

16. The method of claim 14, further comprising:
after purging the substrate processing chamber, performing a first chamber seasoning process by exposing interior surfaces of the substrate processing chamber to a silicon-containing gas.

17. The method of claim 16, wherein the purging gas comprises argon and the silicon-containing gas comprises silane ($SiH_4$).

* * * * *